(12) United States Patent
Kanda

(10) Patent No.: US 6,919,611 B2
(45) Date of Patent: Jul. 19, 2005

(54) SEMICONDUCTOR MEMORY REDUCING CURRENT CONSUMPTION AND NARROW CHANNEL EFFECT AND METHOD OF MANUFACTURING THE SAME

(75) Inventor: Masahiko Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 58 days.

(21) Appl. No.: 10/460,411

(22) Filed: Jun. 13, 2003

(65) Prior Publication Data

US 2003/0209756 A1 Nov. 13, 2003

Related U.S. Application Data

(62) Division of application No. 10/186,704, filed on Jul. 2, 2002, now Pat. No. 6,593,189.

(30) Foreign Application Priority Data

Jul. 4, 2001 (JP) ........................................ 2001-203649

(51) Int. Cl.[7] ...................... H01L 21/336; H01L 29/788
(52) U.S. Cl. ........................ 257/501; 257/513; 257/392; 438/FOR 212
(58) Field of Search ................................ 257/501, 513, 257/392, FOR 212

(56) References Cited

U.S. PATENT DOCUMENTS 5,801,083 A 9/1998 Yu et al.
6,342,715 B1 * 1/2002 Shimizu et al. ............. 257/314
6,380,087 B1 * 4/2002 Gupta et al. ................ 438/692
6,486,517 B2 11/2002 Park
6,518,635 B1 * 2/2003 Shiozawa et al. ........... 257/410

FOREIGN PATENT DOCUMENTS

| JP | 11-260906 | 9/1999 |
| KR | 1999-4607 | 1/1999 |

* cited by examiner

Primary Examiner—George Fourson
Assistant Examiner—Thanh V Pham
(74) Attorney, Agent, or Firm—Oblon, Spivak, McClelland, Maier & Neustadt, P.C.

(57) ABSTRACT

Gate structures, comprising a first insulation film, a first gate material and a gate oxide film, are formed. A second insulation film is formed on side surfaces of the gate structures in the peripheral region. Trenches are formed at a surface of the semiconductor substrate by etching the semiconductor substrate with the first and the second insulation films used as masks. The second insulation film formed on side surface of the gate structures is removed, exposing the surface of the semiconductor substrate in the vicinity of the gate structures on both sides of the trenches. Element-isolating insulation films are formed in the trenches and on the exposed substrate. The gate structures in the peripheral region are removed. Gate structures of peripheral transistors are formed between the element-isolating insulation films in the peripheral region.

3 Claims, 10 Drawing Sheets

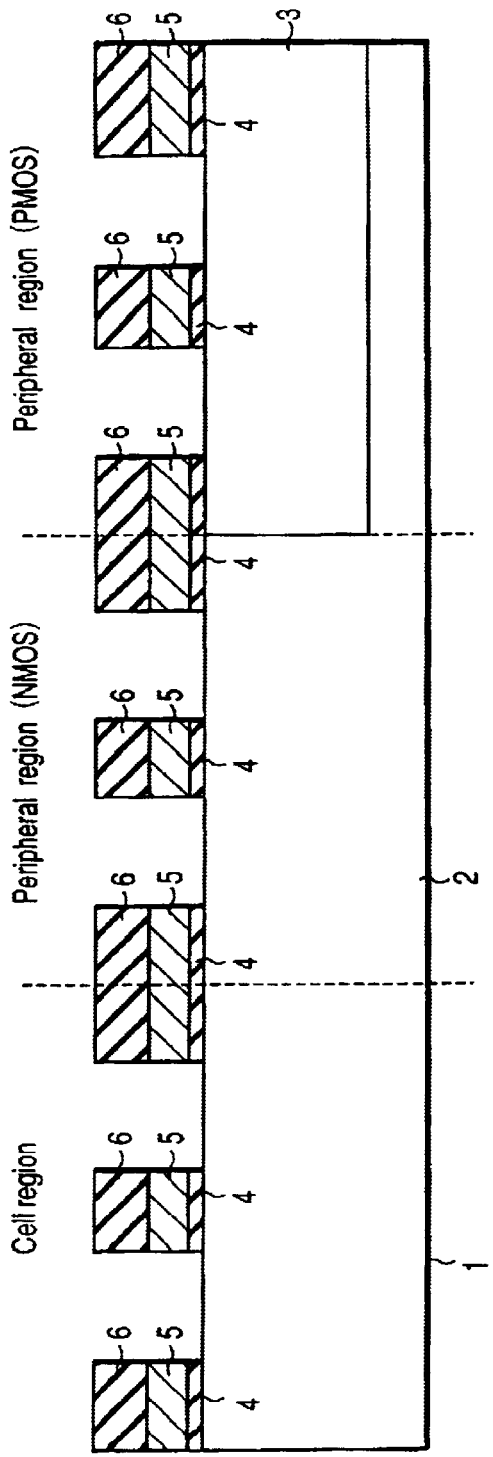
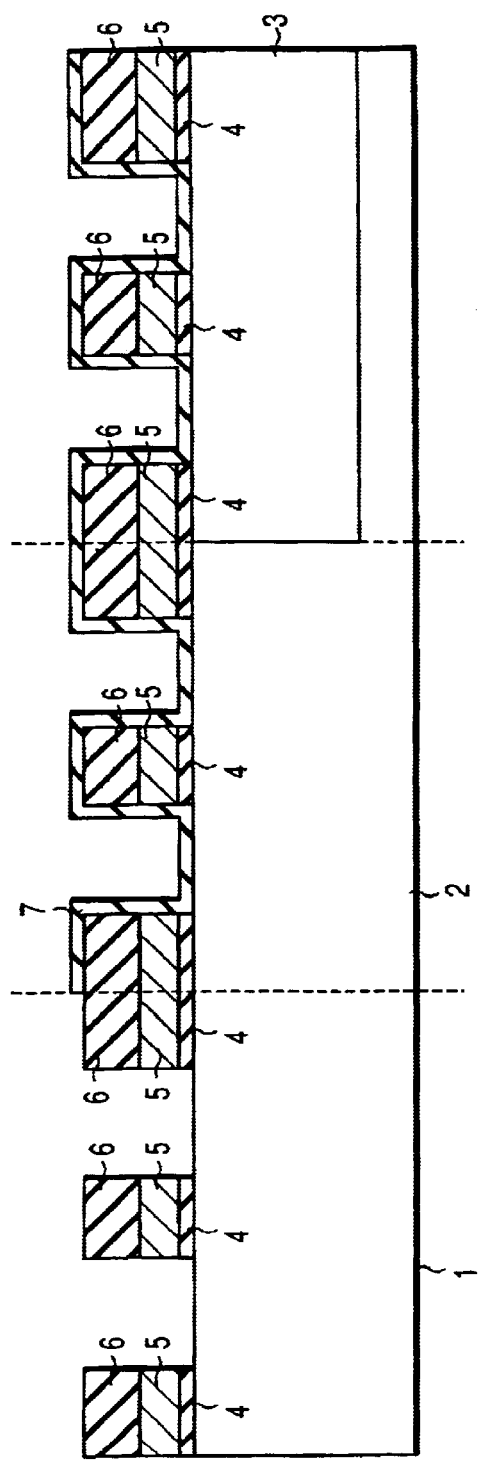
FIG. 1
FIG. 2

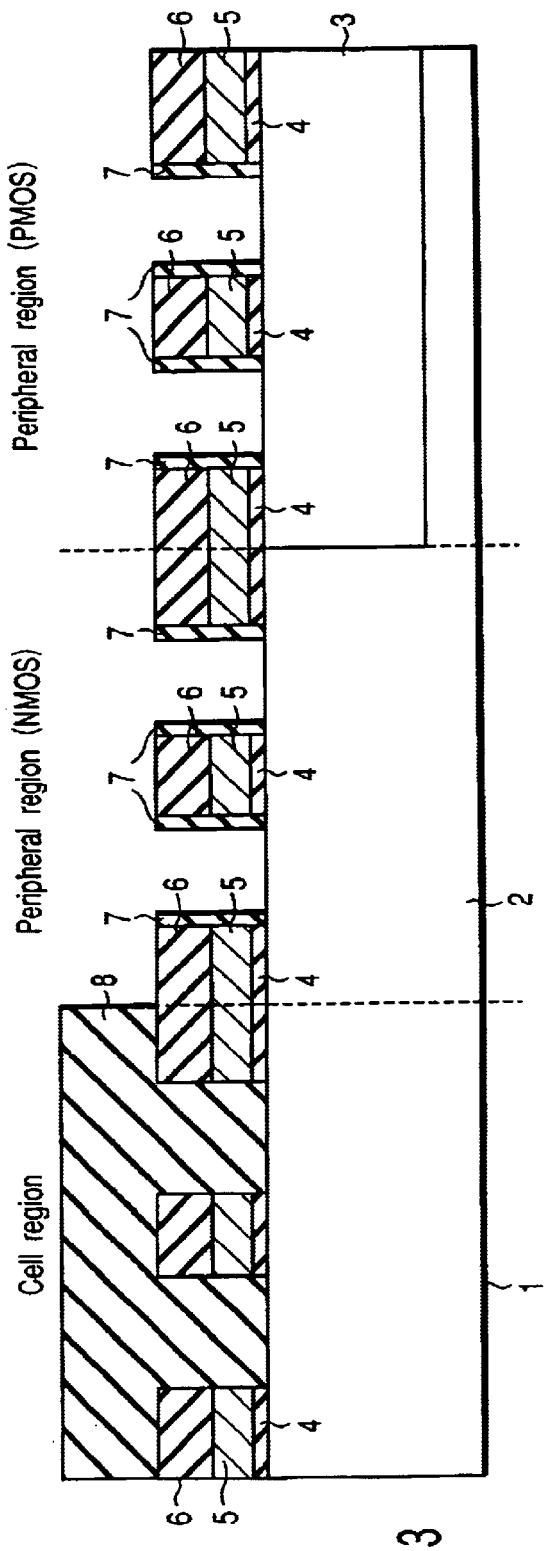
F I G. 3
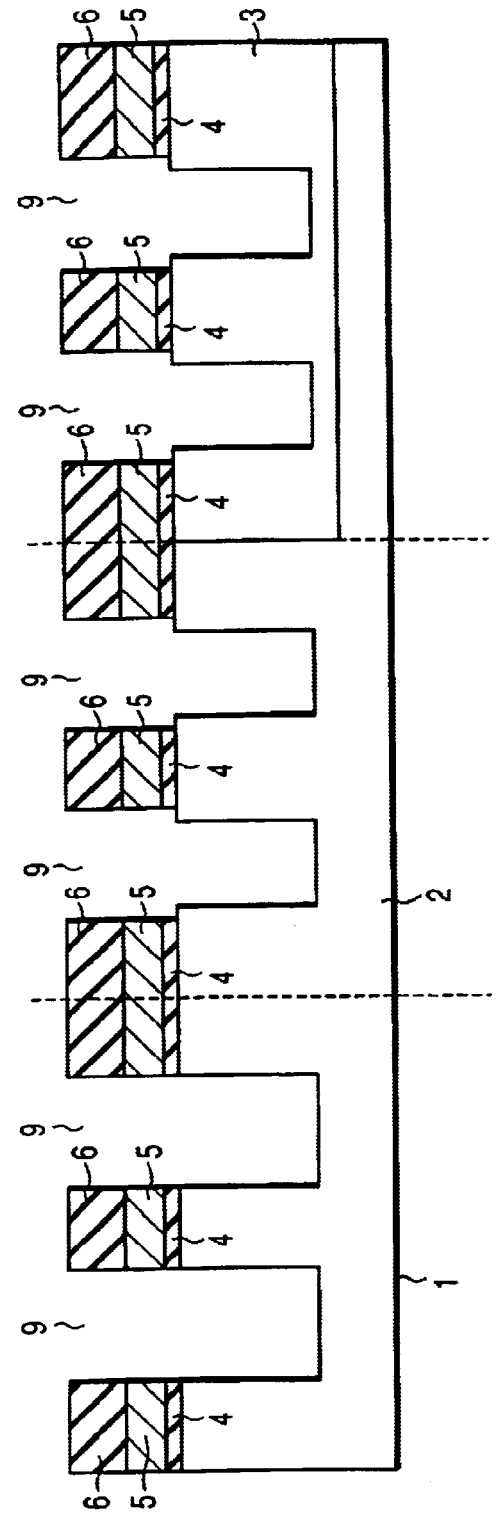
F I G. 4

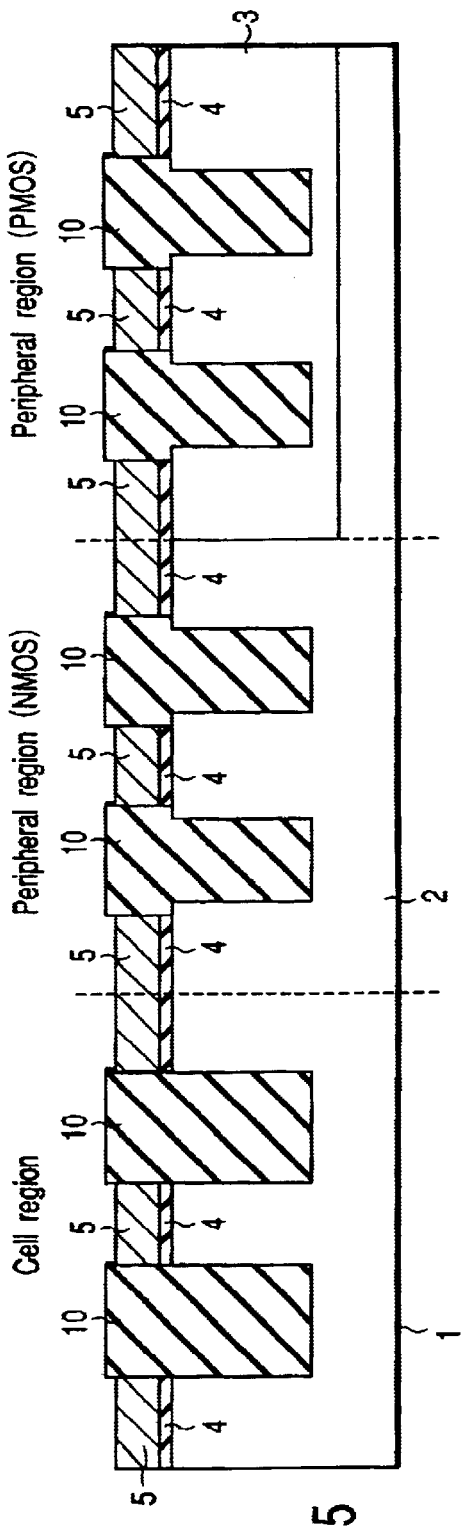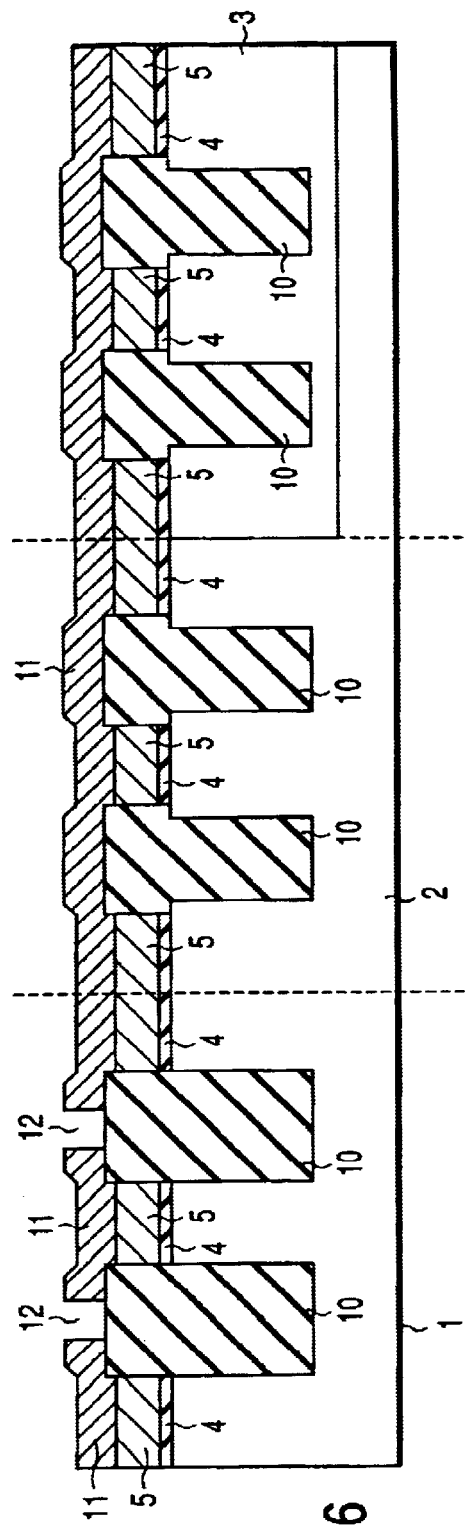
FIG. 5
FIG. 6

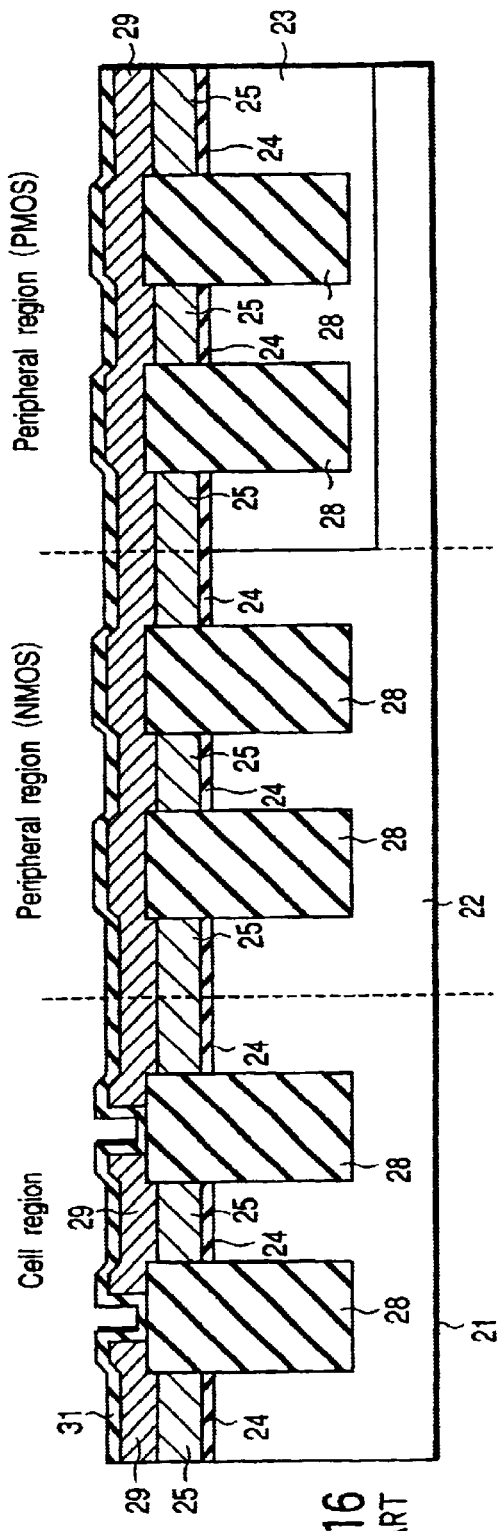
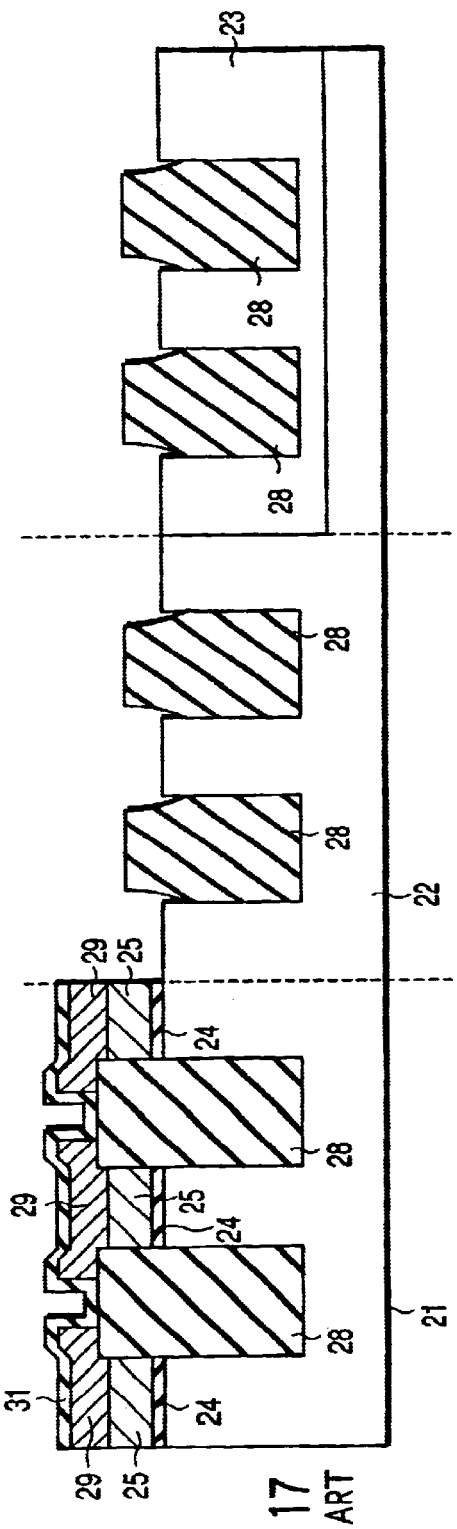
FIG. 16 PRIOR ART
FIG. 17 PRIOR ART

US 6,919,611 B2

SEMICONDUCTOR MEMORY REDUCING CURRENT CONSUMPTION AND NARROW CHANNEL EFFECT AND METHOD OF MANUFACTURING THE SAME

CROSS-REFERENCE TO RELATED APPLICATIONS

This is a divisional application of application Ser. No. 10/186,704, filed Jul. 2, 2002 now U.S. Pat. No. 6,593,189. This application is based upon and claims the benefit of priority from Japanese Patent Application No. 2001-203649, filed Jul. 4, 2001, the entire contents of which are incorporated herein by reference.

BACKGROUND OF THE INVENTION

1. Field of the Invention

The present invention relates to a semiconductor memory and a method of manufacturing the same, in particular, a semiconductor memory which reduces current consumption and narrow channel effect and a method of manufacturing the same.

2. Description of the Related Art

Generally, flash memories have memory cells, and various delay circuits and a writing/erasing high-voltage stabilizing circuit and the like necessary for its operation, inside a chip. Therefore, resistors and devices such as transistors which constitute their peripheral circuits are also formed inside the chip.

When a flash memory having a structure as described above is manufactured, increasing the manufacturing efficiency is required to reduce the manufacturing cost. Therefore, it increases the efficiency to manufacture cell transistors constituting memory cells and transistors constituting peripheral circuits by using almost the same manufacturing process.

FIGS. 12 to 17 show a conventional method of manufacturing a flash memory in sequential order. As shown in FIG. 12, the flash memory has a memory cell array region (hereinafter referred to as "cell region") and a region in which transistors of peripheral circuits are formed (hereinafter referred to as "peripheral region"), on a semiconductor substrate. In the peripheral region, N channel MOSFETs (Metal Oxide Semiconductor Filed Effect Transistor) and P channel MOSFETs are formed.

A P well region 22 is formed on a surface of a semiconductor substrate 21, and thereafter an N well region 23 is formed in a part of the P well region 22 in which P channel MOSs of the peripheral region are formed. Then, a gate insulating film 24 is formed on the whole surface of the semiconductor substrate 21, and a first gate material 25 is formed on the gate insulating film 24. A silicon nitride film 26 and a silicon oxide film (not shown) are sequentially deposited on the first gate material 25. The silicon oxide film, silicon nitride film 26, first gate material 25 and gate oxide film 24 are etched by photolithography. The remaining silicon oxide film is removed.

As shown in FIG. 13, the surface of the semiconductor substrate 21 is etched with the silicon nitride film 26 used as a mask, forming trenches 27.

As shown in FIG. 14, inner walls of the trenches 27 are oxidized, and thereafter a silicon oxide film 28 serving as a device-isolating insulating film is deposited on the whole surface of the semiconductor device, and the silicon oxide film 28 is flattened. The silicon nitride film 26 is removed by wet etching, forming device-isolating regions comprising the silicon oxide film 28.

As shown in FIG. 15, a second gate material 29 is deposited on the whole surface of the semiconductor device. The second gate material 29 is provided directly on the first gate material 25. The first gate material 25 and the second gate material 29 constitute a floating gate of a memory cell in a later step. The second gate material 29 on the silicon oxide film 28 in the cell region is etched by photolithography, forming a slit 30 in the second gate material 29 on each silicon oxide film 28. The slit 30 isolates a floating gate for each memory cell from others. A photoresist used in the photolithography is removed.

As shown in FIG. 16, an ONO film 31 comprising a silicon oxide film, a silicon nitride film and a silicon oxide film is deposited on the whole surface of the semiconductor device.

In FIG. 17, a photoresist (not shown) is formed only in the cell region, by photolithography. With the photoresist used as a mask, the ONO film 31, the first gate material 25 and the second gate material 29 in the peripheral region are removed. Then, the gate oxide film 24 in the peripheral region is removed by wet etching using $NH_4F$ or the like, and thereafter the photoresist in the cell region is removed.

A gate insulating film for MOSFETs is formed in the peripheral region by a known method, and a polysilicon film, for example, is deposited on the whole surface of the semiconductor device. Then, the polysilicon film is etched by means of photolithography and anisotropic etching using RIE, and thereby control gates and floating gates are formed in the cell region.

Gate electrodes of MOSFETs are formed by photolithography and anisotropic etching using RIE. Then, post oxidation is performed.

Impurities are diffused in the cell region and the peripheral region, forming source and drain regions. Then, gate sidewalls are formed, and thereafter a salicide is formed on the gate electrode and the semiconductor substrate of the thus-formed diffusion layer. A silicon nitride film and a BPSG (Boron Doped Phospho-Silicate Glass) are coated on the whole surface of the semiconductor device.

Contact holes are formed by photolithography and RIE, and an Al wiring film is deposited thereon by sputtering or the like. After a wiring pattern is formed by photolithography and RIE, a PSG (Phospho-Silicate Glass) is deposited to protect the Al wiring. Then, a silicon nitride film is deposited, and the PSG n a bonding pad is removed by etching to complete the device as a wafer.

As described above, the gate insulating film 24 on the peripheral region is removed by wet etching. Therefore, as shown in FIG. 17, etching solution entering between each of the silicon oxide film 28 and the semiconductor substrate 21 etches the silicon oxide films 28, and thereby edge portions of the silicon oxide films 28 are also reduced. This generates a gap between each silicon oxide film 28 and the semiconductor substrate 21. When gate electrodes are deposited in the following step, a gate electrode material is embedded in the gaps. Electric field concentrates in the parts in which the gate electrode material is embedded. Therefore, kink property appears in subthreshold characteristics, which increases the current consumed by the MOSFET including the gate electrode. Further, this causes the problem that the narrow channel effect of the MOSFET becomes more significant and thereby the operation speed of the MOSFET decreases.

BRIEF SUMMARY OF THE INVENTION

A method of manufacturing a semiconductor memory, having a cell region in which a cell transistor is formed and a peripheral region in which peripheral transistor of peripheral circuit is formed, according to a first aspect of the present invention comprises forming a gate oxide film, a first gate material and a first insulation film on a semiconductor substrate in the cell region and the peripheral region; forming a plurality of gate structures comprising the first insulation film, the first gate material and the gate oxide film in the cell region and the peripheral region, by etching a part of the first insulation film, the first gate material, and the gate oxide film; forming a second insulation film on side surfaces of the gate structures formed in the peripheral region; forming a plurality of trenches at a surface of the semiconductor substrate in the cell region and the peripheral region, by etching the semiconductor substrate with the first insulation film and the second insulation film used as masks; exposing the surface of the semiconductor substrate in the vicinity of the gate structures on both sides of the trenches, by removing the second insulation film on the side surfaces of the gate structures formed in the peripheral region; forming element-isolating insulation films in the trenches in the cell region, and in the trenches in the peripheral region such that the films extend onto the surface of the semiconductor substrate in the vicinity of the gate structures; removing the gate structures formed in the peripheral region; and forming gate structures of the peripheral transistors between the element-isolating insulation films of the peripheral region.

A semiconductor device according to a second aspect of the present invention comprises a cell transistor formed in a cell region; first element-isolating insulation films provided in trenches formed at a surface of a semiconductor substrate in the cell region; a peripheral transistor formed in a peripheral region; and second element-isolating insulation films provided in trenches formed at the surface of the semiconductor substrate in the peripheral region, the second element-isolating insulation film having different shape from the first element-isolating insulation film, and having rounded edge portions projecting from the semiconductor substrate.

BRIEF DESCRIPTION OF THE SEVERAL VIEWS OF THE DRAWING

FIG. 1 is a cross-sectional view illustrating a semiconductor memory according to the present invention.

FIG. 2 is a diagram illustrating a step following FIG. 1.

FIG. 3 is a diagram illustrating a step following FIG. 2.

FIG. 4 is a diagram illustrating a step following FIG. 3.

FIG. 5 is a diagram illustrating a step following FIG. 4.

FIG. 6 is a diagram illustrating a step following FIG. 5.

FIG. 16 is a diagram illustrating a step following FIG. 15.

FIG. 17 is a diagram illustrating a step following FIG. 16.

DETAILED DESCRIPTION OF THE INVENTION

Figure 7:
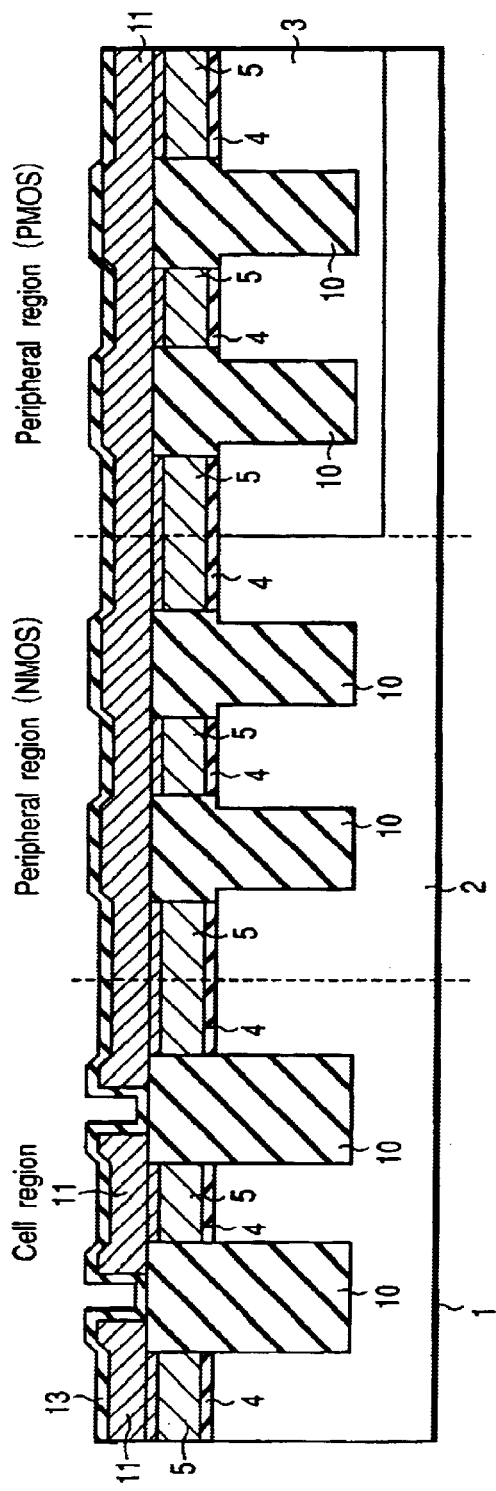
FIG. 7 is a diagram illustrating a step following FIG. 6.

Embodiments of the present invention will now be described with reference to drawings. In the following explanation, the same reference numerals denote constituent elements having almost the same functions and structures, and their explanation is repeated only when necessary.

FIGS. 1 to 9 are cross-sectional views showing a method of manufacturing a flash memory according to this embodiment in sequential order. As shown in FIG. 1, the flash memory has a cell region and a peripheral region. N channel MOSFETs and P channel MOSFETs are formed in the peripheral region.

A P well region 2 is formed on a surface of a semiconductor substrate 1. In the peripheral region, an N well region 3 is formed in a part of the P well region 2, in which P channel MOSFETs are to be formed. A gate oxide film 4 is formed on the whole surface of the semiconductor substrate 1 by means of thermal oxidation. A first gate material 5 made of polysilicon or amorphous silicon or the like is deposited on the gate oxide film 4 by CVD (Chemical Vapor Deposition). A silicon nitride film 6 and a first silicon oxide film (not shown) are sequentially deposited on the first gate material 5 by CVD or the like.

A photoresist (not shown) is deposited on the silicon oxide film, and an element region pattern is transferred onto the photoresist by photolithography. Then, with the photoresist used as a mask, the first silicon oxide film and the silicon nitride film 6 are etched by RIE (Reactive Ion Etching) or the like. Thereafter, with the silicon nitride film 6 used as a mask, the first gate material 5 and the gate oxide film 4 are etched by RIE, for example. As a result, opening portions corresponding the element region pattern are formed at the silicon nitride film 6, the first gate material 5 and the gate oxide film 4, exposing a part of the surface of the semiconductor substrate 1. The photoresist and the first silicon oxide film are removed.

As shown in FIG. 2, a silicon oxide film 7 having a thickness of 20–35 nm, preferably 30 nm, is deposited on the whole surface of the semiconductor device by CVD or the like. A photoresist (not shown) is deposited on the whole surface of the semiconductor device, and only the photoresist in the cell region is removed by using photolithography. Then, with the photoresist used as a mask, the silicon oxide film 7 in the cell region is removed by wet etching or the like. Thereafter, the photoresist in the peripheral region is removed.

As shown in FIG. 3, a photoresist 8 is deposited on the whole surface of the semiconductor device, and only the photoresist in the peripheral region is removed by using photolithography. With the photoresist 8 used as a mask, the silicon oxide film 7 formed on the semiconductor substrate 1 and the silicon nitride film 6 in the peripheral region is selectively removed by anisotropic etching such as RIE. As a result, the silicon oxide film 7 is left on the side surfaces of the silicon nitride film 6, the first gate material 5, and the gate oxide film 4.

As shown in FIG. 4, the photoresist 8 in the cell region is removed. Then, the semiconductor substrate 1 is etched by, for example, RIE with the silicon nitride film 6 and the silicon oxide film 7 used as masks, and thereby trenches 9 are formed at the surface of the semiconductor substrate 1 in the cell region and the peripheral region. Thereafter, the silicon oxide film 7 formed on the side surfaces of the silicon nitride film 6, the first gate material 5 and the gate oxide film 4 in the peripheral region is removed by anisotropic etching such as RIE, exposing the surface of the semiconductor substrate 1 adjacent to the trenches 9 in the peripheral region.

As shown in FIG. 5, inner walls of the trenches are oxidized. Thereafter, a silicon oxide film 10, for example, as an element-isolating insulating film is deposited on the whole surface of the semiconductor device. As a result, the silicon oxide film 10 is embedded in the trenches in the cell region. Simultaneously, in the peripheral region, the silicon oxide film 10 is embedded in the trenches. The embedded silicon oxide film 10 extends onto the exposed surface of the semiconductor substrate adjacent to the trenches. The silicon nitride film 10 is flattened by CMP (Chemical Mechanical Polishing) or the like, with the silicon nitride film 6 used as a stopper. Then, the silicon nitride film 6 is removed by wet etching using heated phosphoric acid, for example. Consequently, element-isolating regions made of the silicon oxide film 10 are formed, and thereby device regions are isolated from each other.

As shown in FIG. 6, a second gate material 11 is deposited on the whole surface of the semiconductor device by CVD or the like. The second gate material 11 is made of polysilicon or amorphous silicon and the like, into which phosphorus has been injected as impurities. The second gate material 11 is deposited directly on the first gate material 5. The first gate material 5 and the second gate material 11 are to form floating gates with a two-layer structure for memory cells in a later step.

Next, a photoresist (not shown) is deposited on the whole surface of the semiconductor device. A pattern is transferred to the photoresist. The pattern has a trench on the approximately central portion of each separated silicon oxide film 10 in the cell region. With the photoresist used as a mask, the second gate material 11 is etched by anisotropic etching such as RIE. Consequently, slits 12 are formed at positions corresponding to the trenches of the pattern, in the second gate material 11 on the silicon oxide films 10. Thereby, the second gate material 11 is isolated for each memory cell. Then, the photoresist is removed.

Next, as shown in FIG. 7, an ONO film 13 comprising a silicon oxide film, a silicon nitride film and a silicon oxide film, for example, is deposited on the whole surface of the semiconductor device.

Figure 8:
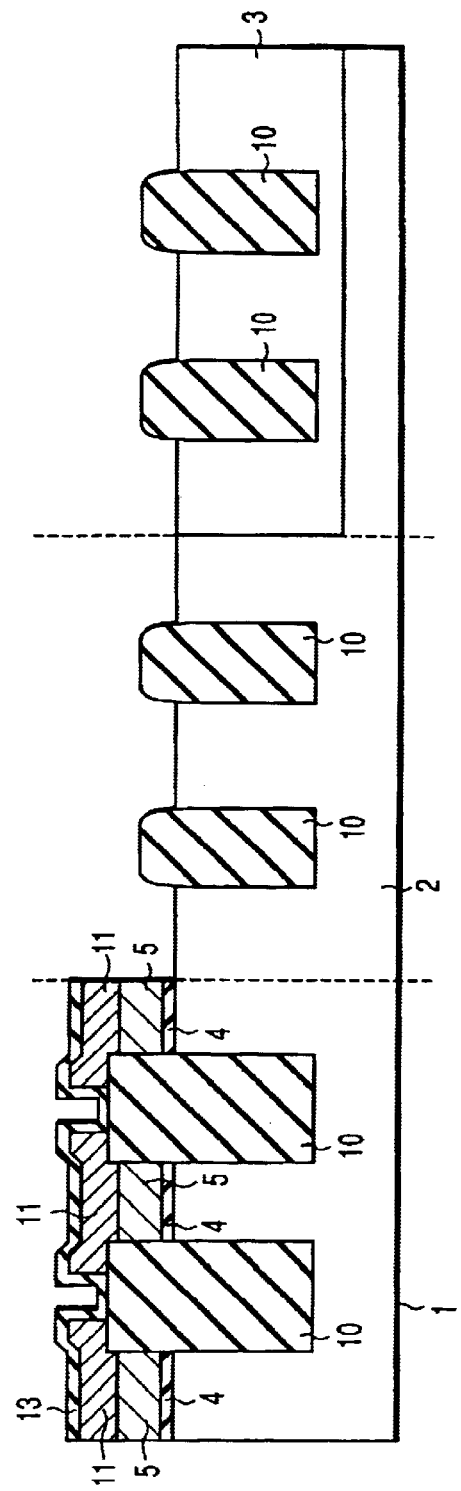
FIG. 8 is a diagram illustrating a step following FIG. 7.

In FIG. 8, a photoresist (not shown) is deposited on the whole surface of the semiconductor device, and only the photoresist on the peripheral region is removed by using photolithography. With the photoresist used as a mask, the ONO film 13 in the peripheral region is removed by RIE or the like. The first gate material 5 and the second gate material 11 in the peripheral region are removed by CDE (Chemical Dry Etching) or the like. Thereafter, the gate oxide film 4 in the peripheral region is removed by wet etching using NH$_4$F or the like, and the photoresist in the cell region is removed. Consequently, among the element-isolating insulating films 10 in the peripheral region, the parts formed on the semiconductor substrate 1 is removed, and the corner portions of the upper surfaces of the insulating films are rounded. Further, the upper surfaces of the element-isolating insulating films 10 in the peripheral region are lower than those of the device-isolating insulating films 10 in the cell region.

Figure 9:
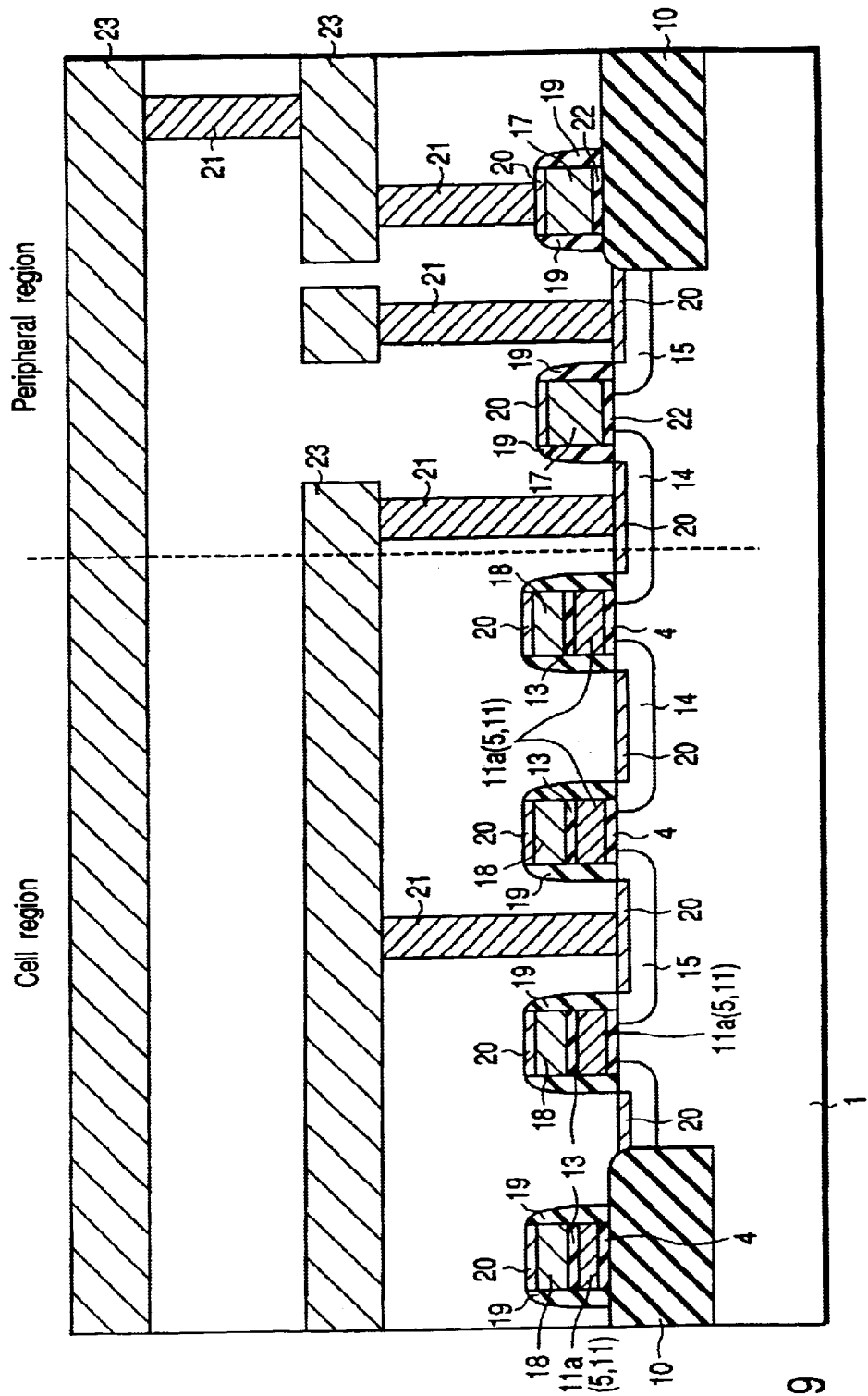
FIG. 9 is a cross-sectional view in a direction crossing the cross-sectional direction shown in FIG. 8, and also a diagram illustrating a step following FIG. 8.

FIG. 9 is a cross-sectional view in a direction crossing the cross-sectional direction shown in FIG. 8, and also illustrates a step following FIG. 8. As shown in FIG. 9, the edge portions of the silicon oxide films 10 projecting from the semiconductor substrate 1 are rounded. After a gate oxide films 22 for a MOSFET is formed in each region, in which a MOSFET is to be formed, in the peripheral region, a polysilicon film, for example, is deposited on the whole surface of the semiconductor device. Then, a photoresist (not shown) is deposited on the polysilicon film, and a gate pattern of memory cells in the cell region is transferred onto the photoresist by using photolithography. With the photoresist used as a mask, the polysilicon film, the first gate material 5, the second gate material 11, and the ONO film 13 are etched by RIE. Consequently, floating gate electrodes 11a each comprising the first gate material 5 and the second gate material 11 and the control electrodes 18 are formed in the cell region. Thereafter, the photoresist is removed.

A photoresist (not shown) is deposited on the polysilicon film in the peripheral region, and a gate pattern of MOSFETs is transferred onto the photoresist by photolithography. With the photoresist used as a mask, the polysilicon film is etched by RIE, and thereby gate electrodes 17 of MOSFETs are formed. Thereafter, the photoresist is removed, and post-oxidation is performed.

Impurities are diffused on the surface of the semiconductor substrate 1 in the cell region and the peripheral region, with the control gate electrodes 18 and the gate electrodes 17 used as masks, forming source regions 14 and the drain regions 15. Then, gate sidewalls 19 are formed on the side surfaces of the gate insulating films 4, floating gates 11a, and the control gates 18 in the cell region and on the side surfaces of the gate insulating films 22 and the gate electrodes 17 of the MOSFETs in the peripheral region. Thereafter, a salicide 20 is formed on each of the control gate electrodes 18 in the cell region, each of the gate electrodes 17 of the MOSFETs in the peripheral region, and the semiconductor substrate of the source regions 14 and the drain regions 15. Consequently, the parts in which the salicide is formed have a low resistance. Thereafter, a silicon nitride film and a BPSG (which are not shown) are deposited on the whole surface of the semiconductor device.

Then, after contact holes are formed by using photolithography and RIE, an Al wiring film is deposited by sputtering or the like. In this process, the contact holes are filled with the Al film, forming contacts 21. After a wiring pattern 23 is formed by processing the Al film by photolithography and RIE, a PSG (not shown) is deposited to protect the Al wiring. Then, a silicon nitride film (not shown) is deposited by PE-CVD (Plasma Enhanced Chemical Vapor Deposition), and the PSG protective material on a bonding pad is processed by etching, and the device is finished as a wafer.

Figure 10:
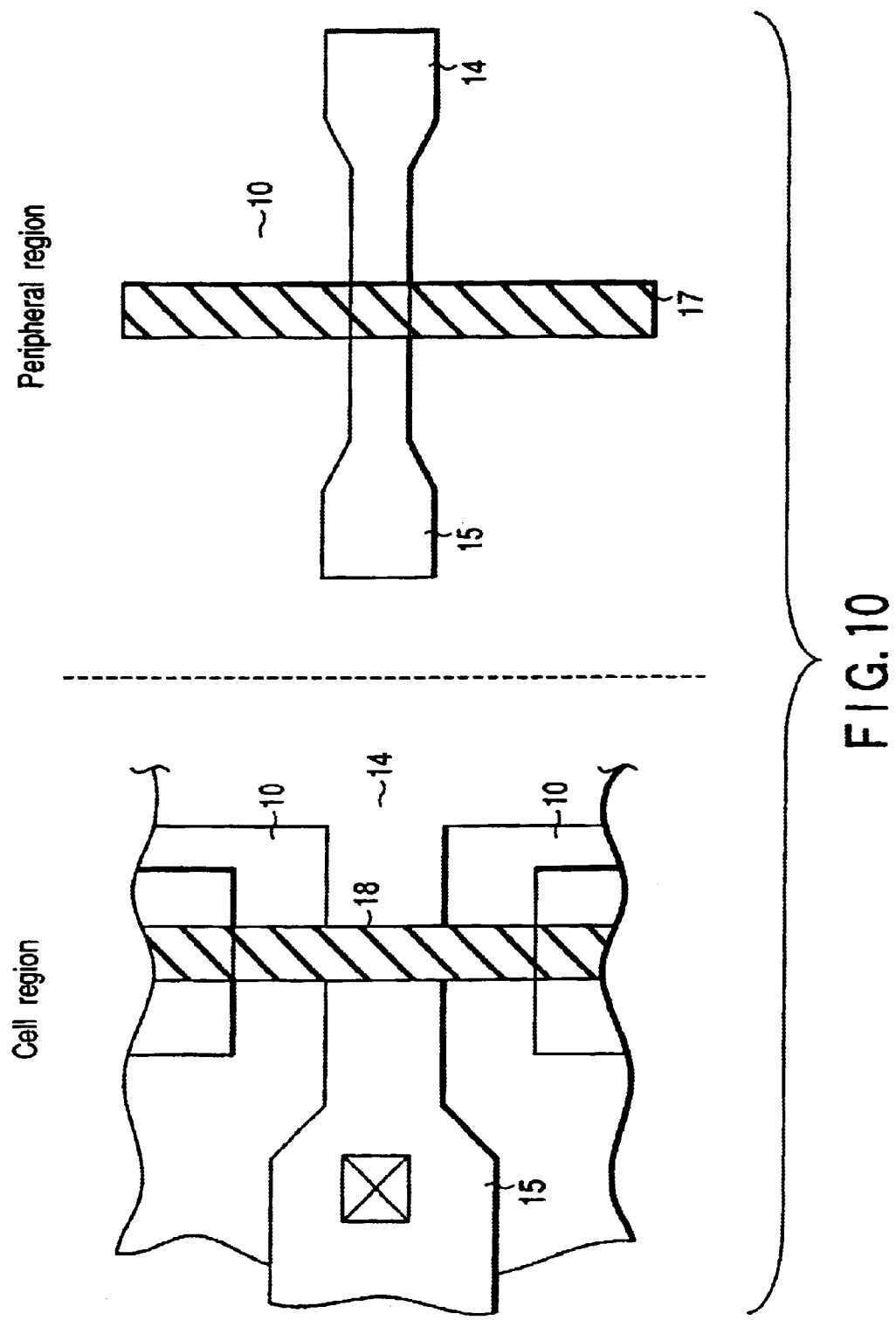
FIG. 10 is a top-side plan view of the structure of FIG. 9.

FIG. 10 is a top-side plan view of the structure shown in FIG. 9. In FIG. 10, reference numerals 10, 14, and 15 denote the silicon oxide film, the source region, and the drain region, respectively. Reference numeral 17 and 18 indicate the gate electrode of a MOSFET and the control gate of a memory cell, respectively.

According to the above embodiment, after the silicon nitride film 6 is deposited, the silicon oxide film 7 is deposited only on the side surfaces of the silicon nitride film 6, the first gate material 5, and the gate oxide film 4 in the peripheral region, thereafter trenches 9 are formed with the silicon oxide film 7 and the silicon nitride film 6 used as masks, and the silicon oxide film 7 is then removed. Therefore, a part of the surface of the semiconductor substrate 1 adjacent to the trenches 9 is exposed, and the silicon oxide film 10 is deposited also on the exposed portions of the surface of the semiconductor substrate 1 when the silicon oxide film 10 is embedded in the trenches 9. Thus, when the silicon nitride film 6, the first gate material 5 and the gate oxide film 4 in the peripheral region are removed by wet etching, it is possible to prevent an etching solution from entering between the silicon oxide films 10 and the semiconductor substrate 1. This prevents formation of gaps between the silicon oxide films 10 and the semiconductor substrate 1, and avoids electric field concentration caused by gate electrode material embedded in the gaps. Therefore, it is possible to avoid the problem that the operation speed decreases due to increase of the power consumption of a MOSFET including the gate electrode and increase of narrow channel effect, which are caused by kink property of the subthreshold characteristics.

Figure 11:
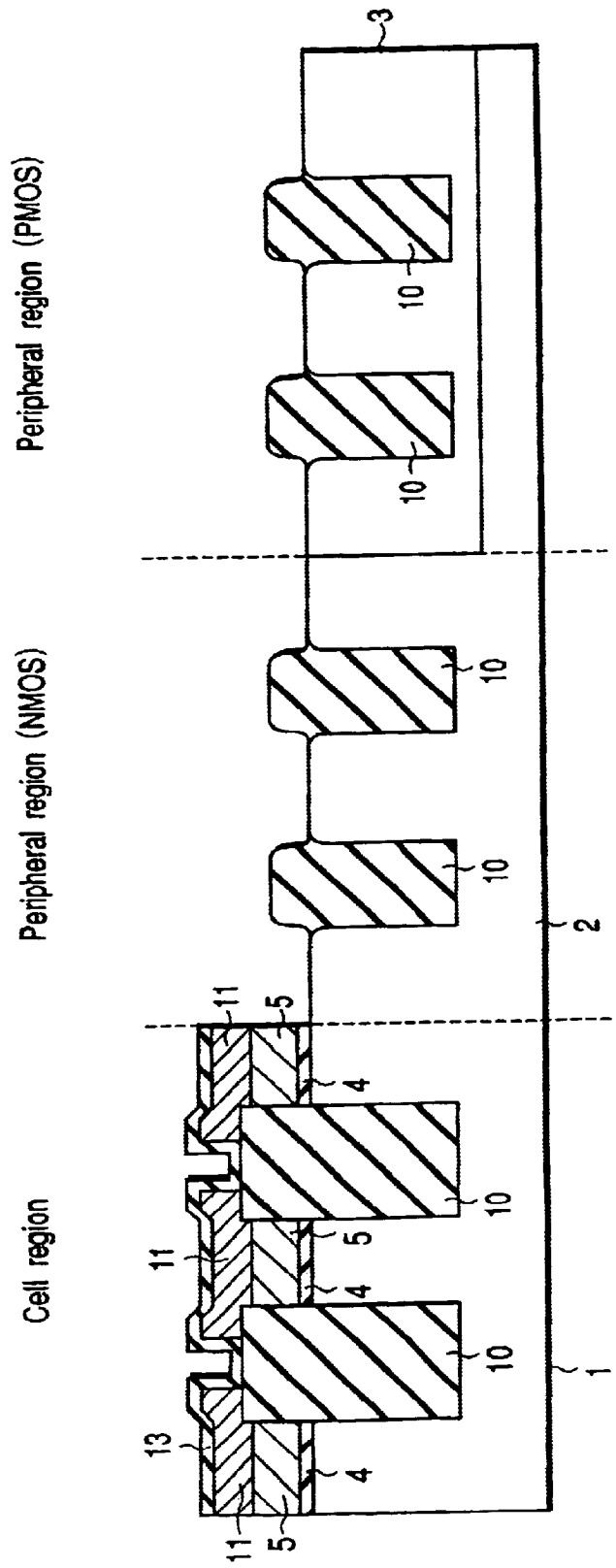
FIG. 11 is a cross-sectional view illustrating another embodiment of the semiconductor memory according to the present invention.
Figure 12:
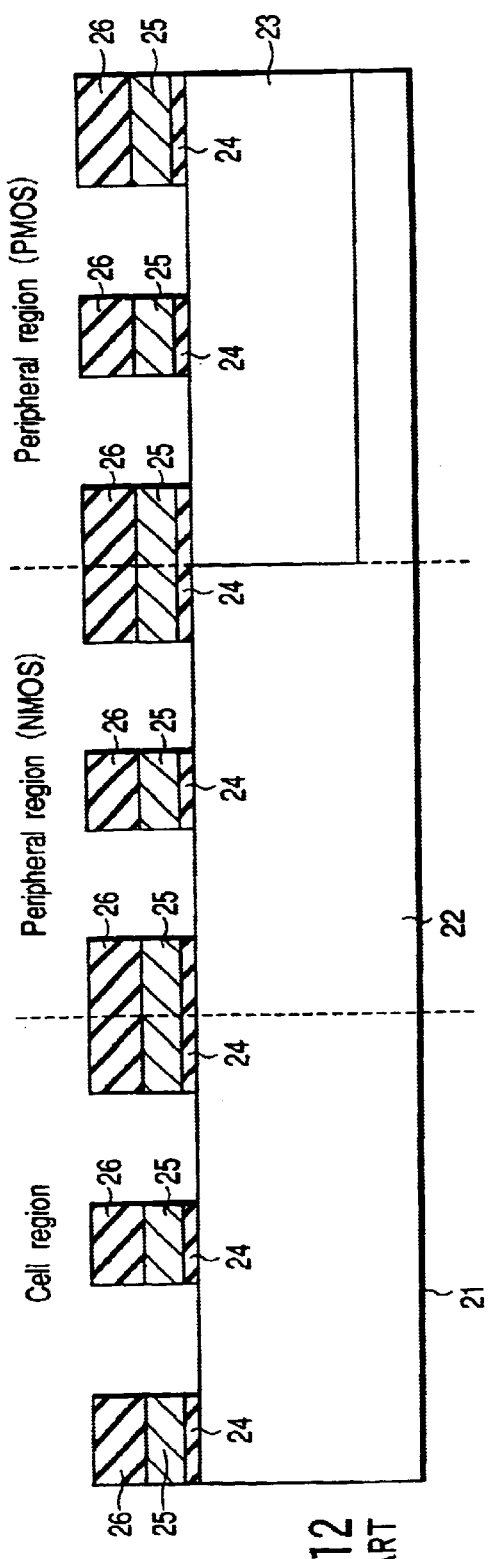
FIG. 12 is a cross-sectional view illustrating a conventional method of manufacturing a semiconductor memory.
Figure 13:
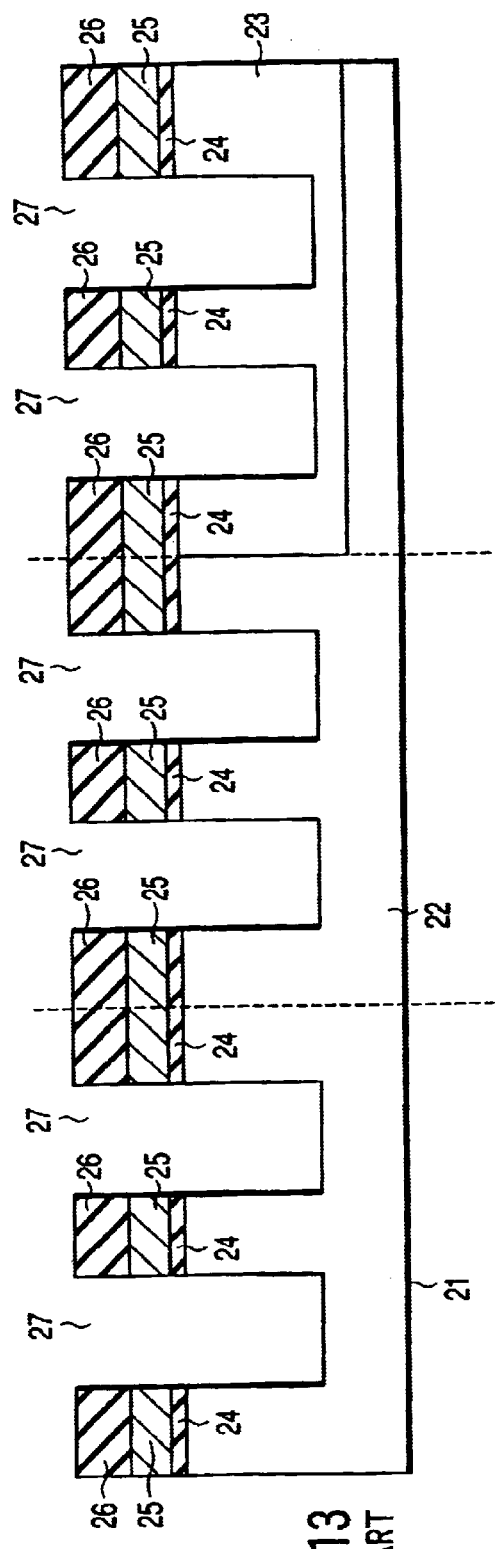
FIG. 13 is a diagram illustrating a step following FIG. 12.
Figure 14:
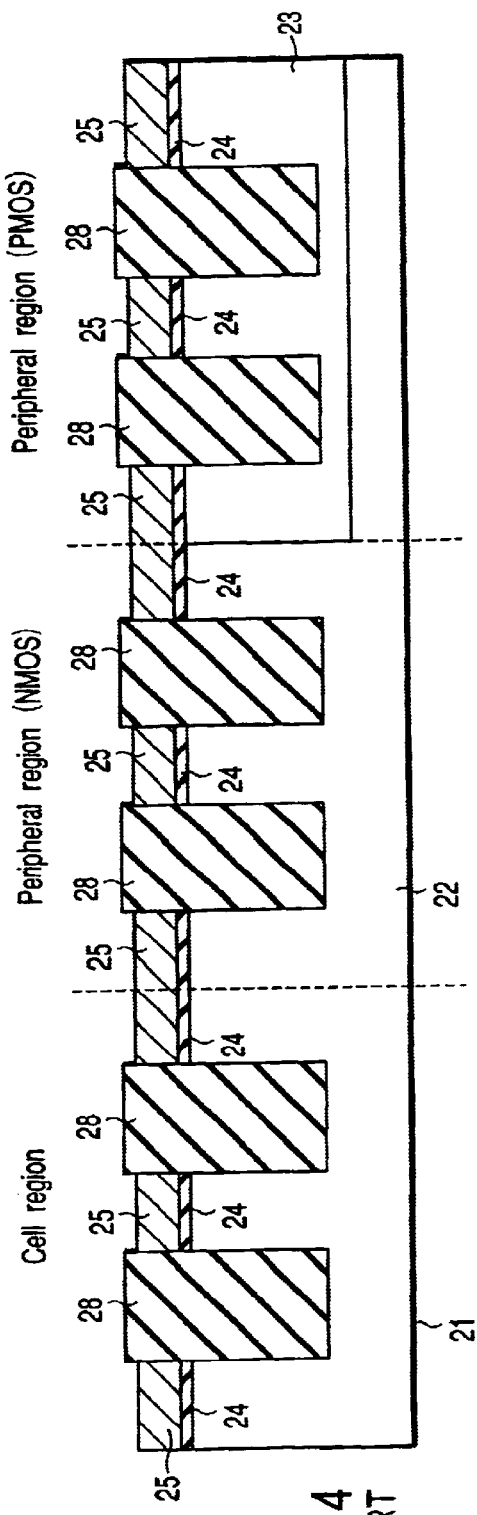
FIG. 14 is a diagram illustrating a step following FIG. 13.
Figure 15:
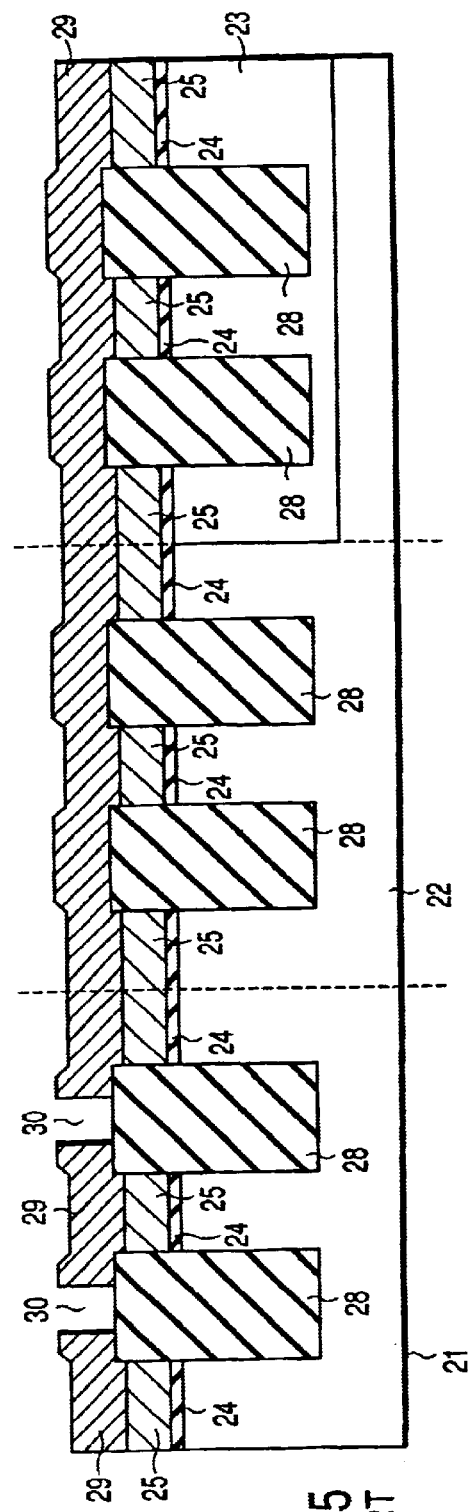
FIG. 15 is a diagram illustrating a step following FIG. 14.

In the above embodiment, after the trenches 9 are formed, the trenches 9 are filled with the silicon oxide film 10. However, as shown in FIG. 11, it is also possible to adopt the structure wherein corner portions of the semiconductor substrate 1 around the trenches 9 are rounded by etching after formation of the trenches 9. When the silicon oxide film 10 is deposited in a later step, the silicon oxide film 10 is formed also on the rounded portions. This can prevent generation of electric field concentration in the rounded portions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a cell transistor formed in a cell region;

first element-isolating insulation films provided in trenches formed at a surface of a semiconductor substrate in the cell region;

a peripheral transistor formed in a peripheral region; and second element-isolating insulation films provided in trenches formed at the surface of the semiconductor substrate in the peripheral region, the second element-isolating insulation film having different shape from the first element-isolating insulation film, and having rounded edge portions projecting from the semiconductor substrate.

2. A device according to claim 1, wherein upper surfaces of the second element-isolating insulation films are lower than upper surfaces of the first element-isolating insulation films.

3. A device according to claim 1, wherein corner portions of the surface of the semiconductor substrate, contacting the second element-isolating insulation films formed in the trenches of the peripheral region, are rounded in a substantially convex shape.

* * * * *